United States Patent
Haas et al.

(10) Patent No.: US 12,174,271 B2
(45) Date of Patent: Dec. 24, 2024

(54) ADAPTIVE SWITCHING FREQUENCY SELECTION

(71) Applicant: Allegro MicroSystems, LLC, Manchester, NH (US)

(72) Inventors: David J. Haas, Concord, NH (US); Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 133 days.

(21) Appl. No.: 17/525,224

(22) Filed: Nov. 12, 2021

(65) Prior Publication Data

US 2023/0152393 A1 May 18, 2023

(51) Int. Cl.
*G01R 33/00* (2006.01)
*G01D 9/00* (2006.01)

(52) U.S. Cl.
CPC .......... *G01R 33/0023* (2013.01); *G01D 9/00* (2013.01)

(58) Field of Classification Search
CPC .......... G01D 21/00; G01D 9/00; G01D 5/142; G01R 33/0023; G01R 33/07; G01R 33/09; G01R 35/00; H02M 1/44; G06F 3/04166

See application file for complete search history.

(56) References Cited

U.S. PATENT DOCUMENTS

| | | | |
|---|---|---|---|
| 8,008,908 B2 | 8/2011 | Doogue et al. | |
| 8,222,888 B2 | 7/2012 | David et al. | |
| 9,664,494 B2 | 5/2017 | Fernandez et al. | |
| 10,345,417 B2 | 7/2019 | Geisler | |
| 10,635,539 B2 | 4/2020 | Cook et al. | |
| 2011/0137433 A1* | 6/2011 | Bonnat | G06F 1/3215 700/83 |
| 2014/0357392 A1* | 12/2014 | Goel | A63B 53/00 473/223 |
| 2015/0354985 A1* | 12/2015 | Judkins, III | G01B 7/14 324/207.14 |
| 2018/0164948 A1* | 6/2018 | Dinu | G06F 3/0446 |
| 2018/0247522 A1* | 8/2018 | Motz | G08C 15/02 |
| 2021/0311604 A1* | 10/2021 | Kremin | G06F 3/04182 |
| 2022/0209681 A1* | 6/2022 | Reitsma | H03K 5/2472 |

OTHER PUBLICATIONS

U.S. Appl. No. 17/380,244, filed Jul. 20, 2021, Cesaretti, et al.

* cited by examiner

*Primary Examiner* — Yoshihisa Ishizuka
*Assistant Examiner* — Carter W Ferrell
(74) *Attorney, Agent, or Firm* — Daly, Crowley, Mofford & Durkee, LLP

(57) ABSTRACT

A method is provided for use in a sensor, the method comprising: selecting a switching cycle for the sensor; transitioning the sensor into a state in which at least one component of the sensor is periodically turned on and off in accordance with the switching cycle; sampling an analog signal to generate a sampled signal, the analog signal being generated by at least one sensing element, the analog signal being sampled only during periods in which the at least one component of the sensor is turned on; and generating an output signal based, at least in part, on the sampled signal and outputting the output signal.

20 Claims, 8 Drawing Sheets

ADAPTIVE SWITCHING FREQUENCY SELECTION

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a method is provided for use in a sensor, the method comprising: selecting a switching cycle for the sensor; transitioning the sensor into a state in which at least one component of the sensor is periodically turned on and off in accordance with the switching cycle; sampling an analog signal to generate a sampled signal, the analog signal being generated by at least one sensing element, the analog signal being sampled only during periods in which the at least one component of the sensor is turned on; and generating an output signal based, at least in part, on the sampled signal and outputting the output signal.

According to aspects of the disclosure, a sensor is provided, comprising: a sensing element; and a processing circuitry configured to: select a switching cycle for the sensor; and transition the sensor into a state in which at least one component of the sensor is periodically turned on and off in accordance with the switching cycle; sample an analog signal to generate a sampled signal, the analog signal being generated by at least one sensing element, the analog signal being sampled only during periods in which the at least one component of the sensor is turned on; and generate an output signal based, at least in part, on the sampled signal and output the output signal.

According to aspects of the disclosure, a non-transitory computer-readable medium that is configured to store one or more processor-executable instructions, which, when executed by a processing circuitry, cause the processing circuitry to perform the operations of: selecting a switching cycle for a sensor; and transitioning the sensor into a state in which at least one component of the sensor is periodically turned on and off in accordance with the switching cycle; sampling an analog signal to generate a sampled signal, the analog signal being generated by at least one sensing element, the analog signal being sampled only during periods in which the at least one component of the sensor is turned on; and generating an output signal based, at least in part, on the sampled signal and outputting the output signal.

According to aspects of the disclosure, a sensor is provided comprising: means for selecting a switching cycle for the sensor; and means for transitioning the sensor into a state in which at least one component of the sensor is periodically turned on and off in accordance with the switching cycle; means for sampling an analog signal to generate a sampled signal, the analog signal being generated by at least one sensing element, the analog signal being sampled only during periods in which the at least one component of the sensor is turned on; means for; and means for generating an output signal based, at least in part, on the sampled signal.

BRIEF DESCRIPTION OF THE DRAWINGS

The foregoing features may be more fully understood from the following description of the drawings in which.

DETAILED DESCRIPTION

Figure 1:
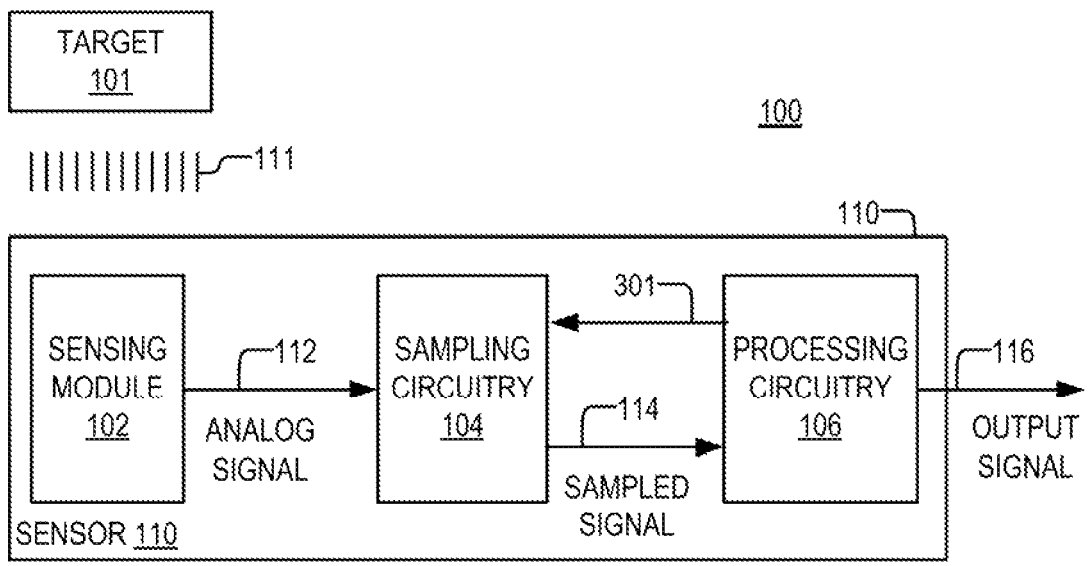
FIG. 1 is a diagram of an example of a sensor, according to aspects of the disclosure.

FIG. 1 is a diagram of an example of a system 100, according to aspects of the disclosure. As illustrated, the system 100 includes a target 101 and a sensor 110 that is configured to detect a magnetic field 111 that is associated with the target.

The target 101 according to the present example includes a permanent magnet. However alternative implementations are possible in which the target 101 includes a metal object (e.g., a gear, a metal wire, etc.) and/or any other suitable type of target 101. The magnetic field 111 may include one or more of a magnetic field that is generated by the target 101, a magnetic field that is induced in the target 101 by a coil, and or a magnetic field that is produced by a back bias magnet and subsequently modulated by the target 101. The sensor 110 may include an angle sensor, a speed sensor, a current sensor, and/or any other suitable type of magnetic field sensor. The sensor 110 may be configured to generate an output signal 116, as shown. The output signal 116 may include any suitable type of output signal, such as a signal that is indicative of the position of the target 101, a signal that is indicative of the speed of the target 101, and/or any other suitable type of signal.

The sensor 110 may include a sensing module 102, sampling circuitry 104, and processing circuitry 106. The sensing module 102 may include one or more magnetic field sensing elements. In some implementations, the sensing module 102 may include a bridge circuit that is formed by using magnetic field sensing elements. In some implementations, any of the magnetic field sensing elements in the sensing module 102 may include a giant magentoresistor (GMR), a tunnel magentoresistor (TMR), a Hall effect element, a receiving coil, and/or any other suitable type of magnetic field sensing element. The sampling circuitry 104 may include one or more analog-to-digital converters. The processing circuitry 106 may include any electronic circuitry that is part of the sensor 110. For example, the processing circuitry may include one or more of digital logic, an application-specific integrated circuit (ASIC), a field-programmable gate array (FPGA), a general-purpose processor, a CORDIC processor, and/or any other suitable type of electronic circuitry that is arranged to process digital signals. Additionally, or alternatively, in some implementations, the processing circuitry 106 may include a power controller. Additionally, or alternatively, in some implementations, the processing circuitry 106 may include a memory controller.

In operation, the sensing module 102 may generate at least a signal 112. According to the present example, signal 112 is an analog signal. The sampling circuitry 104 may sample the signal 112 to produce a signal 114. According to the present example, the signal 114 is a digital signal. The processing circuitry 106 may process the signal 114 to produce the output signal 116. Furthermore, the processing circuitry 106 may be configured to produce a signal 301 and provide the signal 301 to the sampling circuitry 104. The signal 301 may be a signal that is configured to turn the sampling circuitry on and off. Although in the example of FIG. 1, the signal 301 is configured to turn the sampling circuitry 104 on and off, alternative implementations are possible in which the signal 301 is configured to turn on and off any other component or components of the sensor 110 in addition (or instead of) the sampling circuitry 104. Examples of components that may be turned on and off with the signal 301 include an amplifier, a frequency chopper (that is part of the sensing module 102), an analog filter circuit, a memory module, and/or any component of the processing circuitry 106 and/or sensor 110.

The signal 301 may be used to operate the sensor 110 is in a low-power mode. In low-power mode, the signal 301 may alternate between a logic-high and a logic-low value. When the signal 301 is at logic-high, one or more components of the sensor 110 (e.g., the sampling circuitry 104, etc.) may be turned on. When the signal 301 is at logic-low, one or more components of the sensor 110 may be turned off. In some implementations, a component may be turned off when the component is powered off. Additionally, or alternatively, in some implementations, a component may be turned off when current flow to the component is interrupted by means of an independent control system. The frequency of the signal 301 is herein referred to as "switching frequency." As used throughout the disclosure, the term "switching frequency of a sensor" shall refer to a frequency at which at least one component of a sensor is turned on and off. Under the nomenclature of the present disclosure, the component of the sensor that is being turned on and off may be referred to as a "power-cycled component."

The processing circuitry 106 is configured to execute a process for the selection of a switching frequency, which results in a favorable distribution of harmonic components of the signal 114. The switching frequency of the sensor 110 determines (at least partially) the rate at which the signal 112 is sampled. Consequently, the switching frequency of the sensor 110 determines the positions of different harmonic components of the signal 114 in the frequency spectrum. As is discussed further below, the processing circuitry 106 is configured to select the switching frequency of the sensor 110 such that the harmonic components of the signal 114 are staggered away from out-of-band interference signals that are present in the environment of the sensor 110. This is advantageous because it enables the signal 114 to be filtered aggressively to remove the out-of-band interference signals.

FIG. 1 is provided as an example only. Although in the example of FIG. 1, the sensor 110 is a magnetic field sensor, alternative implementations are possible in which the sensor 110 is a different type of sensor. For example, the sensor 110 may be an optical sensor, a pressure sensor, a humidity sensor, a temperature sensor, and/or any other suitable type of sensor. Although in the example of FIG. 1, the sensing module 102 includes one or more magnetic field sensing elements, alternative implementations are possible in which the sensing module 102 includes a light sensing element, a pressure sensing element, a temperature sensing element, a humidity sensing element, and/or any other suitable type of sensing element. Although the sensor 110 is depicted as including only one channel, it will be understood that alternative implementations are possible in which the sensor 110 includes multiple channels. Stated succinctly, the present disclosure is not limited to any specific implementation of the sensor 110.

Figure 2:
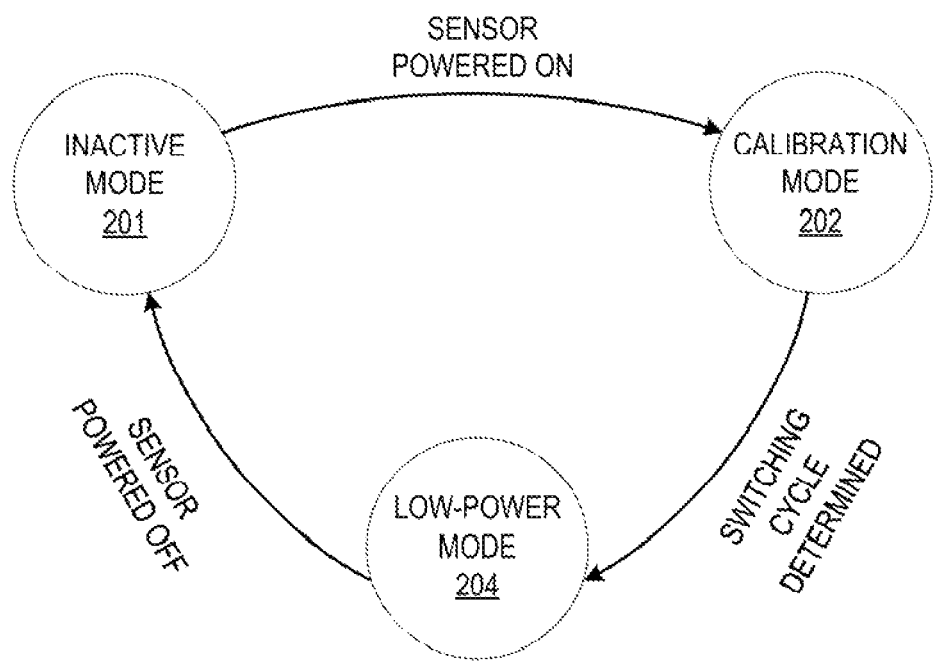
FIG. 2 is a state diagram illustrating aspects of the operation of the sensor of FIG. 1, according to aspects of the disclosure.

FIG. 2 is a state diagram illustrating aspects of the operation of the sensor 110. As illustrated, during its operation, the sensor 110 may be in one of an inactive mode 201, a calibration mode 202, and a low-power mode 204.

When the sensor 110 is the inactive mode 201, the sensor 110 may be powered off or otherwise inactive. That is, all components of the sensor 110 may be turned off or otherwise rendered inactive. When the sensor 110 is in the calibration mode 202, the processing circuitry 106 may execute a process for determining the switching frequency of the sensor 110 (e.g., determine the frequency of the signal 301, etc.). For example, in some implementations, when the sensor 110 is in the calibration mode 202, the sensor 110 may execute one of processes 1000-1100, which are discussed further below with respect to FIGS. 10 and 11, respectively.

When the sensor 110 is in the low-power mode 204, one or more components of the sensor 110 may be turned on and off periodically, as discussed above with respect to FIG. 1. In other words, the one or more components may be power-cycled. Furthermore, when the sensor is in the low-power mode 204, the processing circuitry 106 (or only a portion of the processing circuitry which controls the power-cycling of the one or more components) may be continuously turned on. This is in contrast to the inactive mode 201, in which the processing circuitry 106 (or only the portion of the processing circuitry which controls the power-cycling) may be turned off.

In some implementations, the sensor 110 may transition from the inactive mode 201 to the calibration mode 202 when the sensor 110 is powered on. The sensor 110 may transition from the calibration mode 202 to the low-power mode 204 after the processing circuitry 106 has determined a switching frequency for the sensor 110. For example, the sensor 110 may transition from the calibration mode 202 to the low-power mode after the processor 120 has finished executing one of processes 1000-1100 (shown in FIGS. 10-11). The sensor 110 may transition from the low-power mode 204 to the inactive mode 201 when the sensor 110 is powered off.

Although in the example of FIG. 2 the sensor 110 is configured to operate in low-power mode only, alternative implementations are possible in which the sensor 110 is configured to operate in both low-power mode 204 and a normal operating mode (not shown). When the sensor 110 is running in the normal operating mode, the one or more components of the sensor 110, which are periodically turned on and off when the sensor 110 is in low-power mode, may be turned on all the time. Stated succinctly, the present disclosure is not limited to any specific configuration of the sensor 110, as long as the sensor 110 is configured to operate in low-power mode.

Figure 3:
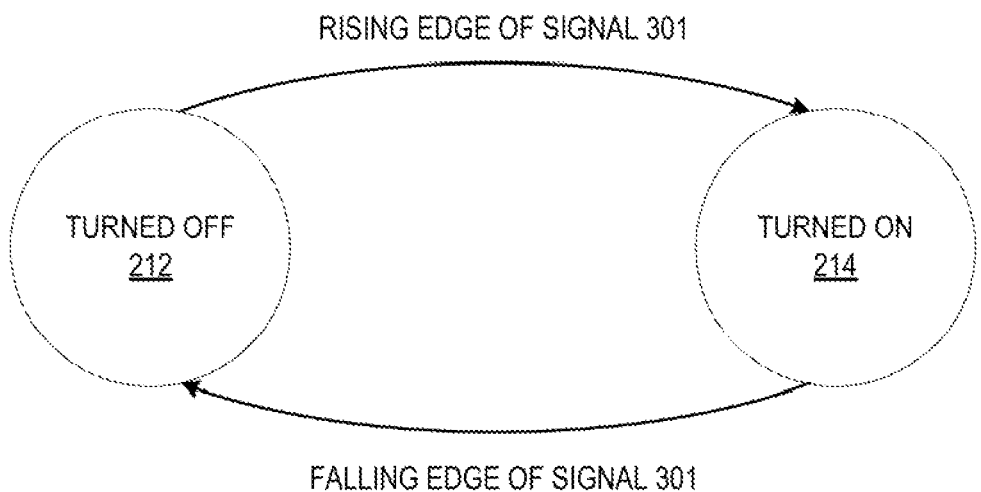
FIG. 3 is a state diagram illustrating aspects of the operation of the sensor of FIG. 1, according to aspects of the disclosure.

FIG. 3 is a state diagram illustrating the operation of the sensor 110 when the sensor 110 is in the low-power mode 204. As illustrated, when the sensor 110 is operating in the low-power mode 204, the sensor 110 may be in one of a state 212 and a state 214. When the sensor 110 is in the state 212, one or more components of the sensor 110 may be turned off. When the sensor 110 in the state 214, the same one or more components of the sensor 110 may be turned on. The sensor 110 may transition out of the state 212 and into the state 214 on the rising edge of the signal 301. The sensor 110 may transition out of state 214 and into 212 on the falling edge of the signal 301.

According to the present example, the processing circuitry 106 samples the signal 112 only when the sensor 110 is in the state 214. When the sensor 110 is in the state 212, no samples of the signal 112 are obtained by the processing circuitry 106. It will be understood that the number of samples captured by the processing circuitry 106 when the sensor 110 is in the state 212 may vary. For example, the processing circuitry 106 may capture only one sample of signal 112 every time the sensor 110 is in state 214 or, alternatively, the processing circuitry 106 may capture multiple samples of the signal 112 every time the sensor 110 is in state 214. Irrespective of how many samples are taken during each on-period of the sensor 110 (i.e., each time when the sensor 110 is in the state 214), the fundamental frequency at which the signal 112 is sampled depends on the switching frequency of the sensor 110. Under the present arrangement, it is the switching frequency of the signal 301 that (at least in part) determines the spectral distribution of the harmonic components of the signal 114. As used throughout the disclosure, the term "distribution of harmonic components of a signal" refers to the pattern in which the frequencies of some (or all) harmonic components of the signal are spaced apart from one another (or otherwise distributed) in the frequency spectrum.

Figure 4:
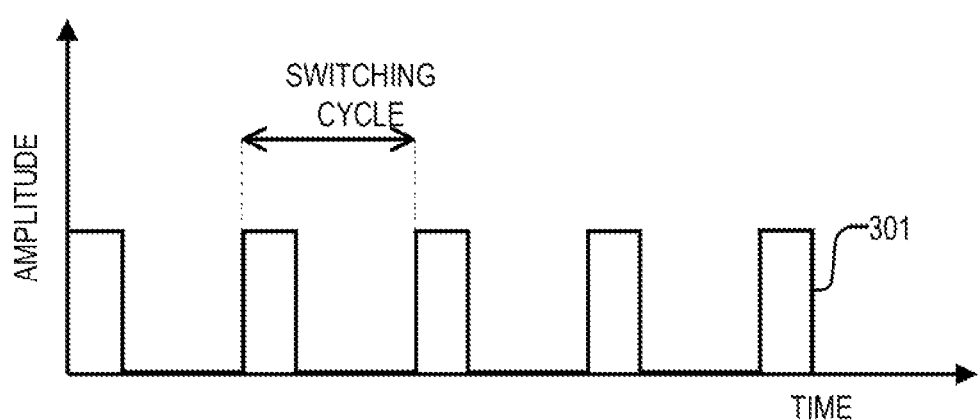
FIG. 4 is a time-domain plot of an example of a signal that is configured to switch sampling circuitry on and off, according to aspects of the disclosure.

FIG. 4 is a plot of the signal 301, according to aspects of the disclosure. The signal 301 may have a square waveform that is characterized by a switching cycle. The switching cycle of the signal 301 may be equal to the time period between two successive rising edges of the signal 301. However, it will be clear to those of ordinary skill in the art, after reading this disclosure, that the switching cycle of the signal 301 may be defined as the time period between two successive falling edges of the signal 301 or in any other suitable manner.

Figure 5:
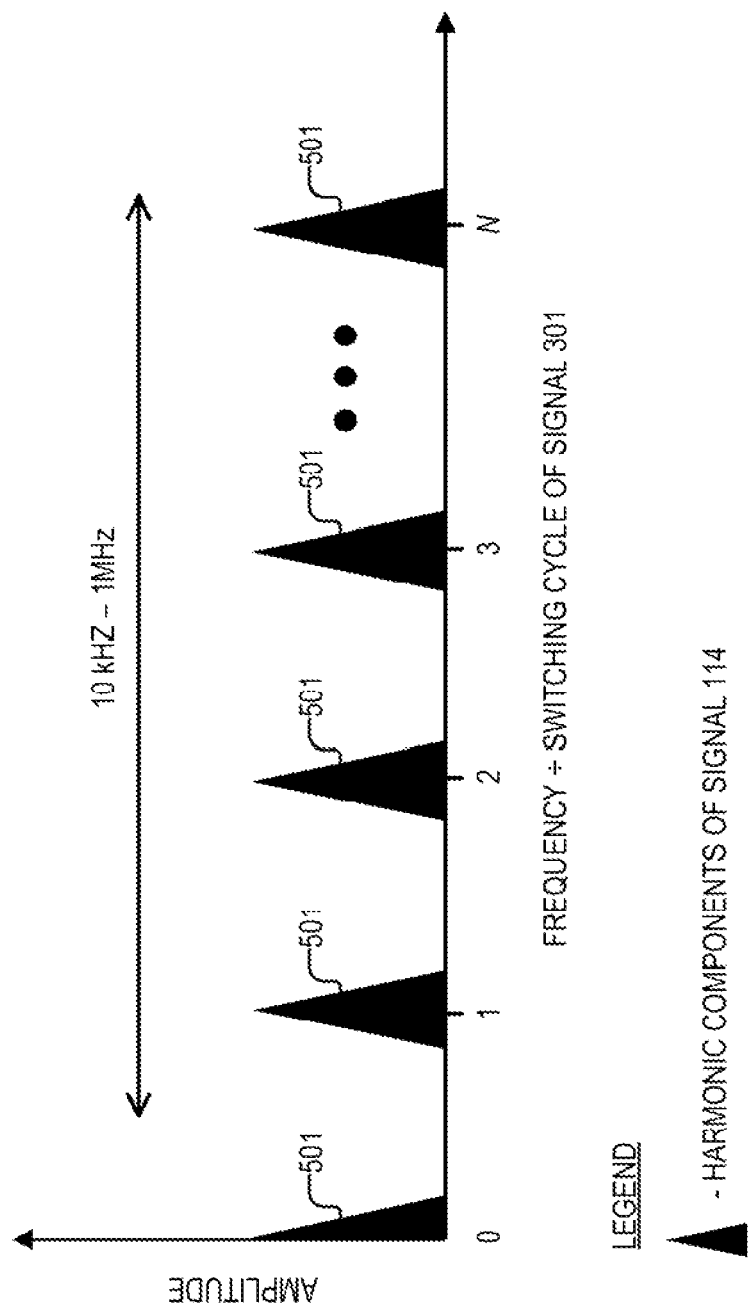
FIG. 5 is a frequency-domain plot of the signal that is configured to switch sampling circuitry on and off, according to aspects of the disclosure.

FIG. 5 is a plot of the signal 114 illustrating different harmonic components of the signal 114. The Y-axis of the plot represents the amplitude of each of the frequency harmonics that comprise the signal 114. The X-axis of the plot represents normalized frequency, which is calculated by dividing frequency by the switching cycle of the signal 301. FIG. 5 illustrates that different harmonic components 501 of the signal 114 can be spaced apart from one another along the frequency spectrum (assuming the Nyquist criterion is satisfied).

Figure 6:
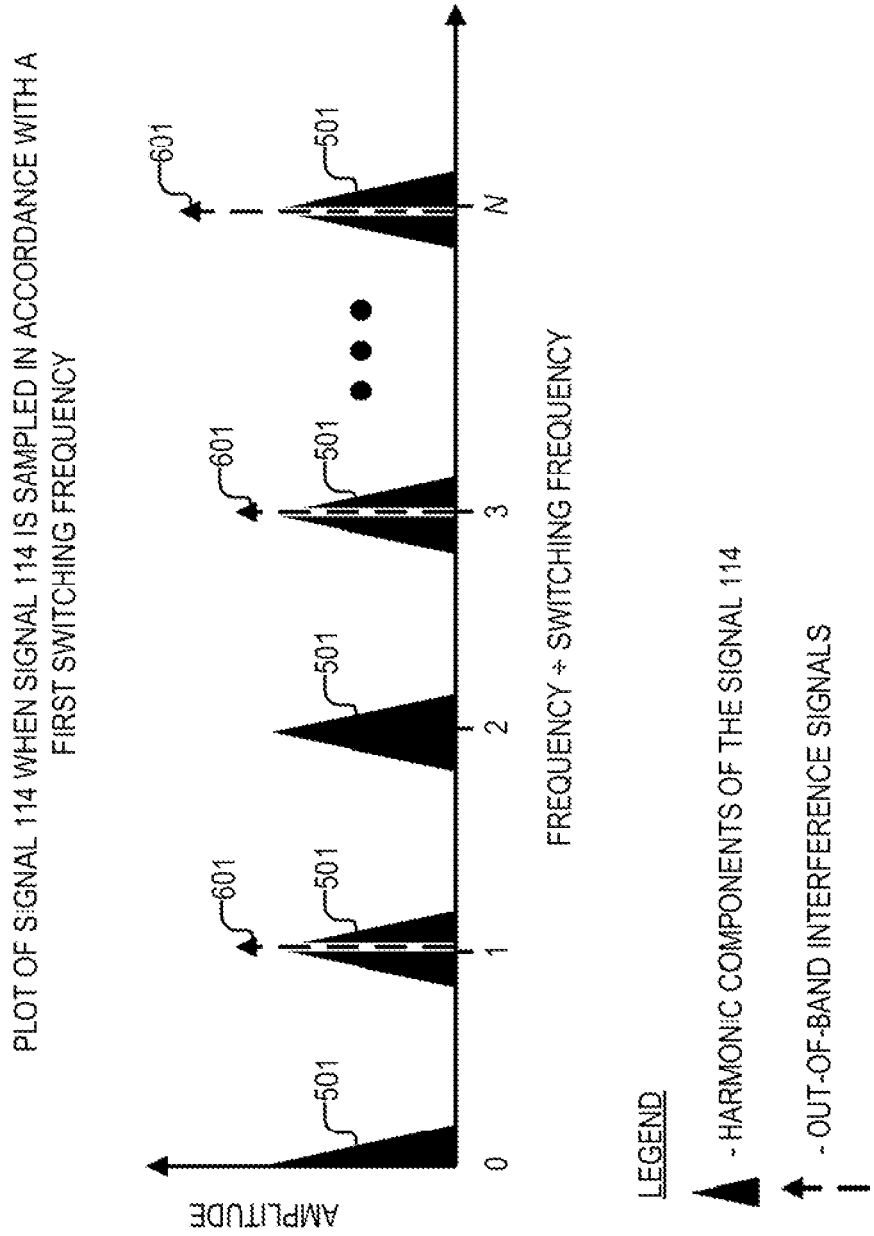
FIG. 6 is a plot illustrating aspects of the operation of the sensor of FIG. 1, according to aspects of the disclosure.

FIG. 6 is a plot of the signal 114 when the signal 114 is sampled in accordance with a first switching frequency of the signal 301. The Y-axis of the plot represents the amplitude of each of the frequency harmonics that comprise the signal 114. The X-axis of the plot represents normalized frequency, which is calculated by dividing frequency by the switching cycle of the signal 301. Further shown in the plot of FIG. 6 are the frequencies of out-of-band interference signals 601 that are present in the environment of the sensor 110. FIG. 6 illustrates that when the signal 114 is sampled in accordance with the first switching frequency, the out-of-band interference signals 601 may overlap with the harmonic components 501 of the signal 114. In other words, the frequency (e.g., fundamental tone) of each out-of-band interference signal 601 may be the same as (or within predetermined distance from) the frequency as a respective one of the harmonic components 501 of the signal 114.

Figure 7:
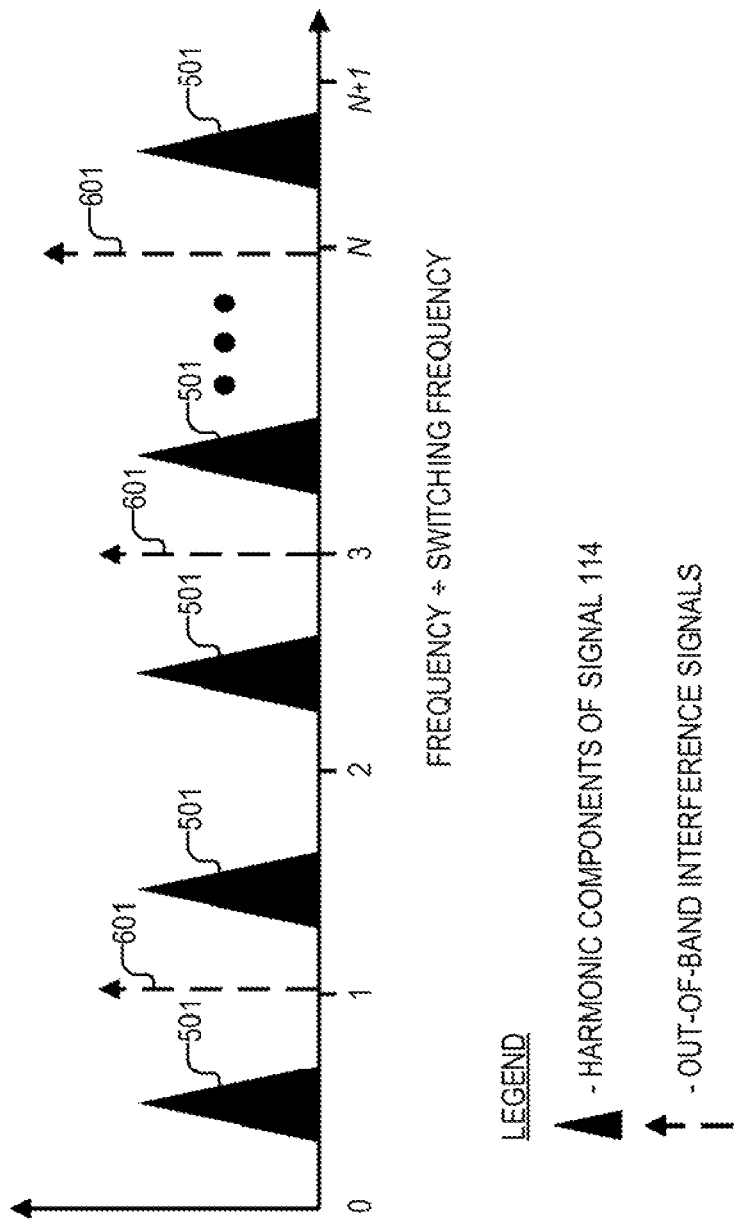
FIG. 7 is a plot illustrating aspects of the operation of the sensor of FIG. 1, according to aspects of the disclosure.

FIG. 7 is a plot of the signal 114 when the signal 114 is sampled in accordance with a second switching frequency of the signal 301. The Y-axis of the plot represents the amplitude of each of the frequency harmonics that comprise the signal 114. The X-axis of the plot represents normalized frequency, which is calculated by dividing frequency by the switching cycle of the signal 301. Further shown in the plot of FIG. 7 are the frequencies of out-of-band interference signals 601 that are present in the environment of the sensor 110. FIG. 7 illustrates that when the signal 114 is sampled in accordance with the second switching frequency, the out-of-band interference signals 601 would not overlap with the harmonic components 501 of the signal 114. In other words, in comparison to the example of FIG. 6, none (or fewer) of the harmonic components 501 of the signal 114 may overlap with the frequencies (e.g., fundamental tones) of the out-of-band interference signals 601.

Figure 8:
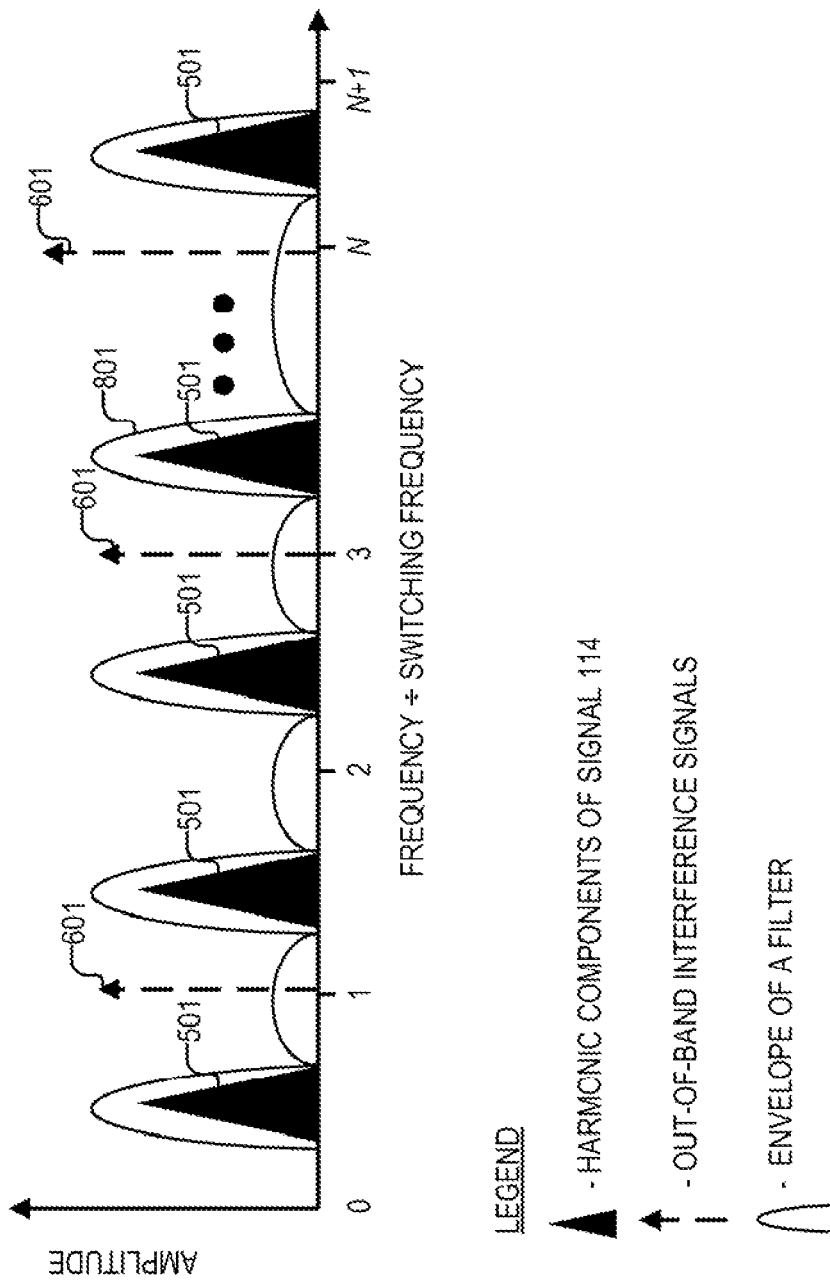
FIG. 8 is a plot illustrating aspects of the operation of the sensor of FIG. 1, according to aspects of the disclosure.

FIG. 8 is a plot of the signal 114 when the signal 114 is sampled in accordance with a second switching frequency of the signal 301. The Y-axis of the plot represents the amplitude of each of the frequency harmonics that comprise the signal 114. The X-axis of the plot represents normalized frequency, which is calculated by dividing frequency by the switching cycle of the signal 301. Further shown in FIG. 8 is the envelope of a filter 801 that is used to filter the signal 114. FIG. 8 illustrates that a selection of a switching frequency (i.e., second switching frequency), which prevents the harmonic components 501 of the signal 114 from overlapping with out-of-band interference signals 601 allows the out-of-band interference signal 601 to be removed (from the signal 114) by the application of (aggressive) filtering. By contrast, as illustrated in the example of FIG. 6, if the first switching frequency is used, the application of aggressive filtering to remove the out-of-band interference signals 601 would not be feasible.

In some respects, FIGS. 6-8 illustrate that the selection of a switching frequency for the sensor 110 may affect the effectiveness of any subsequent filtering that is applied on a signal that is sampled in accordance with the switching frequency. As used throughout the disclosure, the phrase "signal sampled in accordance with a switching frequency of a sensor" may refer to a signal that is sampled only when a power-cycled component is turned on, wherein the power-cycled component is a component that is turned on and off at the switching frequency.

Figures 9, 10:
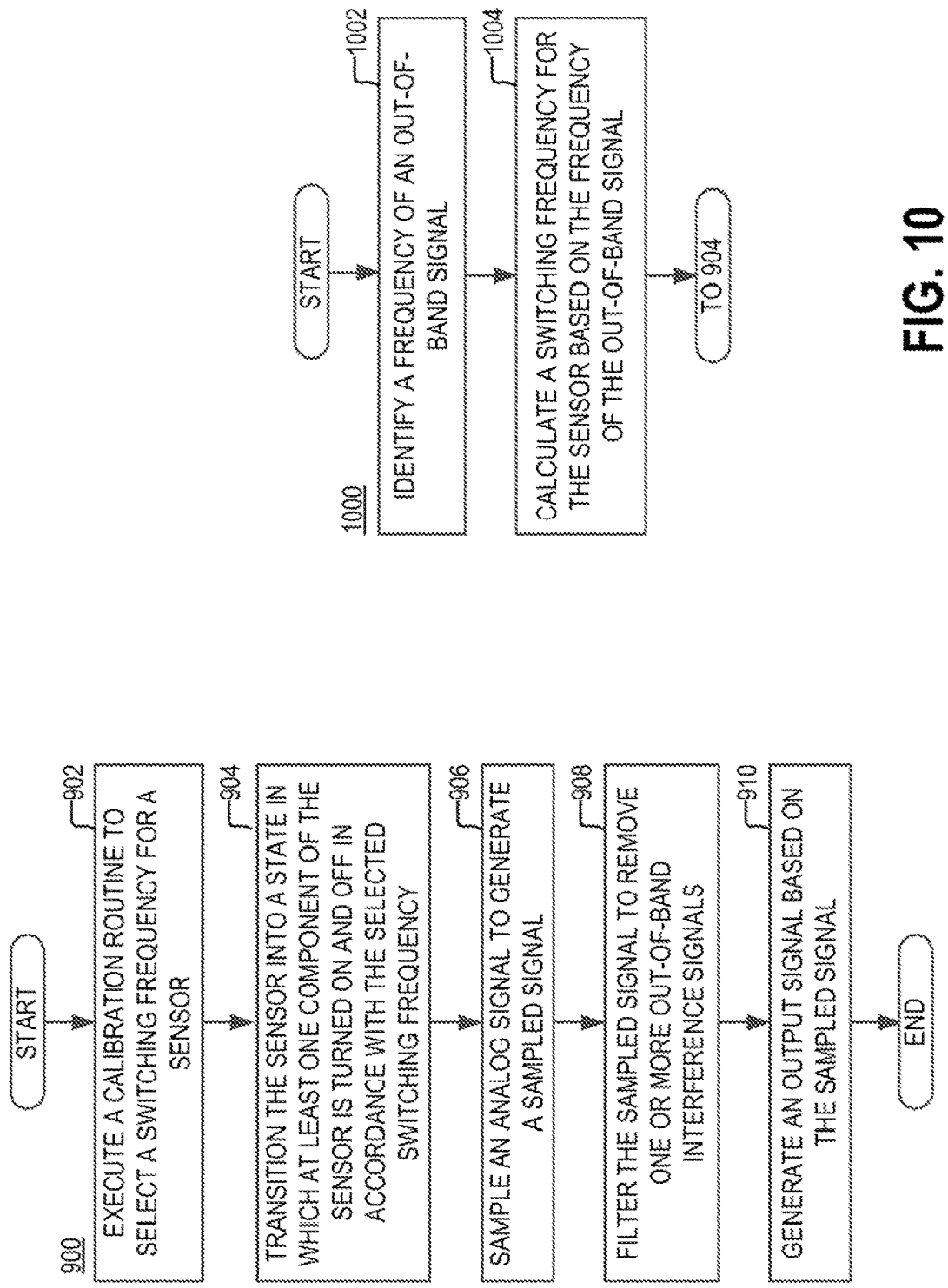
FIG. 9 is a flowchart of an example of a process, according to aspects of the disclosure.
FIG. 10 is a flowchart of an example of a process, according to aspects of the disclosure.

FIG. 9 is a flowchart of an example of a process 900, according to aspects of the disclosure.

At step 902, the processing circuitry 106 selects a switching frequency for the sensor 110. As used throughout the disclosure, the phrase "selecting a switching frequency for a sensor" may refer to at least one of: (1) selecting a frequency at which at least one component of the sensor is turned on and off, (2) selecting a duration for which the at least one component of the sensor is turned off periodically, and/or (3) selecting a duration for which the at least one component of the sensor is turned on periodically. In the implementation of the sensor 110, which is shown in FIG. 1, selecting the switching frequency for the sensor 110 includes selecting a frequency (and/or a specific duty cycle) for the signal 301. For instance, the processing circuitry 106 may select one or more of: (i) the switching frequency of the signal 301, (ii) the duration for which the signal 301 remains at logic-high during each switching cycle of the signal 301, and/or (iii) the duration for which the signal 301 remains at logic low during each switching cycle of the signal 301. In some implementations, the switching frequency may be in the range of 1 Hz-1000 Hz. However, it will be understood that the present disclosure is not limited to any specific switching frequency being selected.

In some implementations, a switching frequency may be selected for the sensor 110 at step 902, which prevents one or more harmonic components 501 of the signal 114 from overlapping with the frequency (e.g., fundamental tone, etc.) of at least one out-of-band interference signal 601 that is present in the environment of the sensor 110. In some implementations, step 902 may be executed when the sensor 110 is in the calibration mode 202 (shown in FIG. 2). In some implementations, step 902 may be executed in accordance with one of processes 1000 and 1100, which are discussed further below with respect to FIGS. 10-11, respectively.

At step 904, the processing circuitry 106 transitions the sensor 110 into a state in which at least one component of the sensor 110 is turned on and off based on the switching frequency (selected at step 902). According to the present example, the processing circuitry 106 transitions the sensor 110 into the low-power mode 204. As noted above, the at least one component of the sensor 110 that is turned on and off may be referred to as a "power-cycled component".

At step 906, the processing circuitry 106 samples the signal 112 with the sampling circuitry 104 to produce the signal 114. As noted above, the signal 112 is sampled only when the power-cycled component is turned on, such that no samples of the signal 112 are obtained when the power-cycled component is turned off. In other words, the signal 112 is sampled in accordance with the switching frequency of the sensor 110, the respective frequencies of any harmonic components 501 of signal 114 are determined by the switching frequency. As noted above, the switching frequency is selected (at step 902) in a way that reduces (or ideally eliminates) the degree to which the harmonic components 501 of the signal 114 overlap with out-of-band interference signals 601.

More specifically, in one example, at step 906, a switching frequency may be selected which produces a distribution of harmonic components of the signal 114 that has the least amount of overlap with the out-of-band interference signals 601. In another example, at step 906, a switching frequency may be selected which produces a distribution of harmonic components of the signal 114 that has no overlap with the out-of-band interference signals 601. For example, the degree of overlap between a distribution of harmonic components of a signal and out-of-band interference signals may be equal to (or otherwise based on) a count of harmonic components in the distribution that have the same frequency as the frequency (e.g., fundamental tone, etc.) of any of the interference signals. Additionally or alternatively, the degree of overlap between a distribution of harmonic components of a signal and out-of-band interference signals may be equal to (or otherwise based on) a count of harmonic components in the distribution whose frequency is within a predetermined distance from the frequency (e.g., fundamental tone, etc.) of any of the interference signals. The distribution of harmonic components of a signal may include all harmonic components of the signal or only the first N harmonic components of the signal, where N is an integer greater than 1.

At step 908, the processing circuitry 106 filters the signal 114 to remove one or more out-of-band interference signals 601 from the signal 114. In some implementations, the signal 114 may be filtered with the filter 801, which is discussed above with respect to FIG. 8. The switching frequency, as noted above, may be selected to reduce (or ideally eliminate) the degree to which the harmonic components 501 of the signal 114 overlap with out-of-band interference signals 601. Such selection is advantageous because it permits the application of aggressive filtering to remove (fully or partially) the out-of-band interference signals 601 from the signal 114.

At step 910, the processing circuitry 106 generates the output signal 116 based on the signal 114. Those of ordinary skill in the art will readily recognize, after reading this disclosure, that there are various ways to generate an output signal (such as the output signal 116) based on a signal that is generated by at least one sensing element (such as the signal 114). In this regard, it will be understood that the present disclosure is not limited to any specific method for generating the signal 116.

FIG. 10 is a flowchart of an example of a process 1000 for selecting a switching cycle for the sensor 110, as specified by step 902 of the process 900.

At step 1002, frequencies of one or more out-of-band interference signals 601 are identified that are incident on the sensor 110. The identified set may include one or more frequencies, wherein each frequency corresponds to a different one of the out-of-band interference signals 601. For example, the frequencies of the out-of-band interference signals 601 may be identified by turning the sensing module 102, sampling the signal 112 at a high enough frequency to be able to capture out-of-band interference signals, and performing a Fourier transform of the sampled signal. However, it will be understood that the present disclosure is not limited to any specific method for identifying the frequencies of the out-of-band interference signals 601.

At step 1004, a switching frequency is identified based on the frequencies of the out-of-band interference signals 601. For example, in some implementations, a switching frequency may be selected that results in harmonic components 501 of the signal 114 which do not overlap with the out-of-band interference signals 601. As another example, a set of candidate switching frequencies may be retrieved from a memory, and a selection may be performed from the set of the switching frequency that results in the least amount of overlap between the harmonic components 501 of the signal 114 and the out-of-band interference signals 601. It will be understood that the present disclosure is not limited to any specific method for obtaining (or calculating) a switching frequency of the sensor 110 which eliminates (or reduces) the overlap between the frequencies of harmonic components 501 of the signal 114 and the frequencies (e.g., fundamental tones) of out-of-band interference signals 601.

Figure 11:
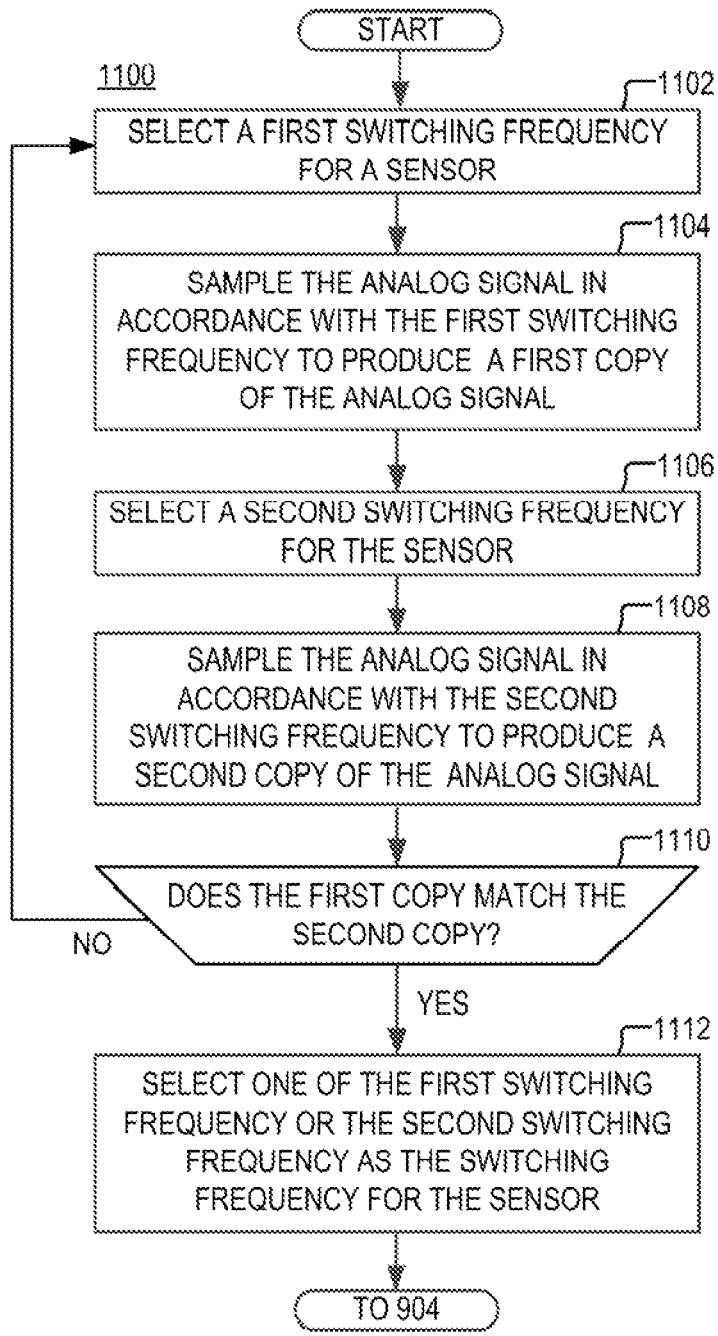
FIG. 11 is a flowchart of an example of a process, according to aspects of the disclosure.

FIG. 11 is a flowchart of an example of a process 1100 for selecting a switching frequency for the sensor 110, as specified by step 902 of the process 900. At step 1102, a first switching frequency is selected for the sensor 110. At step 1104, the signal 112 is sampled in accordance with the first switching frequency to produce a first copy of the signal 112, after which the filtered copy is filtered with a filter that corresponds to the first sampling frequency (i.e. filter that is configured to pass through frequencies where harmonic components resulting from the first sampling frequency are expected to be, etc.). At step 1106, a second switching cycle is selected for the sensor 110. The second switching frequency may be different from the first switching cycle. At step 1108, the signal 112 is sampled in accordance with the second switching cycle to produce a second copy of the signal 112, after which second copy is filtered with a filter that corresponds to the second sampling frequency (i.e. filter that is configured to pass through frequencies where harmonic components resulting from the second sampling frequency are expected to be, etc.). At step 1110, the first filtered copy of the signal 112 is compared to the second filtered copy of the signal 112 to determine if they match. If the second filtered copy and the first filtered copy match, the process 1100 proceeds to step 1112. If the second filtered copy and the first filtered copy do not match, the process 1100 returns to step 1102 and another set of first and second switching frequency is selected. At step 1112, one of the first switching frequency and the second switching frequency is selected as the switching frequency for the sensor 110. In most instances, if the first filtered copy and the second filtered copy match, this is an indication that the harmonic series produced by either one of the first switching frequency and the second switching frequency do not overlap with the frequencies of out-of-band interference signals.

In some implementations, comparing the first copy of the signal 114 with the second copy may include subtracting the first copy of the signal from the second copy (or vice versa) to determine the difference between the first copy and the second copy. In some implementations, the first copy of the signal and the second copy of the signal may match only when the difference is less than or equal to a predetermined threshold.

Sampling the signal 112 in accordance with the first switching frequency may include obtaining samples of the signals 112 which are spaced in time according to a pattern that is consistent with the first switching frequency—i.e., which are taken at times when the power-cycled component would be turned on if the sensor 110 were operated in accordance with the first switching frequency. Sampling the signal 112 in accordance with the second switching frequency may include obtaining samples of the signals 112 which are spaced in time according to a pattern that is consistent with the second switching frequency—i.e., which are taken at times when the power-cycled component would be turned on if the sensor 110 were operated in accordance with the second switching frequency. In other words, steps 1104 and 1108 may be executed by a sampling the signal 112 at a high rate to obtain a set of samples, and then identifying proper subsets of the set, which correspond to the first and second switching frequencies.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., an addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge./. Depending on the device type and other application requirements, the magnetic field sensing element may be a device made of a type IV semiconductor material such as Silicon (Si) or Germanium (Ge), or a type III.-V. semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for use in a sensor, the method comprising:
    selecting a switching frequency for the sensor, the switching frequency being a frequency at which at least a sampling circuitry of the sensor is turned on and off, the switching frequency being selected by a processing circuitry of the sensor;
    transitioning the sensor into a state in which the sampling circuitry of the sensor is turned on and off at the switching frequency;
    sampling an analog signal with the sampling circuitry to generate a sampled signal, the analog signal being generated by at least one sensing element, the analog signal being sampled only at times when the sampling circuitry is turned on, such that no samples of the analog signal are captured when the sampling circuitry is turned off, the sampled signal being provided to the processing circuitry; and generating, by the processing circuitry, an output signal based, at least in part, on the sampled signal and outputting the output signal, wherein selecting the switching frequency for the sensor includes: sampling the analog signal while the sampling circuitry is turned on and off at a first frequency to generate a first copy of the analog signal, the copy being produced by filtering an output of the sampling circuitry with a first filter that corresponds to the first frequency; sampling the analog signal while the sampling circuitry is turned on and off at a second frequency to generate a second copy of the analog signal, the second copy being produced by filtering the output of the sampling circuitry with a second filter that corresponds to the second frequency; calculating a difference between the first copy and the second copy; when the difference meets a threshold, setting one of the first frequency of the second frequency as the switching frequency for the sensor, and when the difference does not meet the threshold, setting a third frequency as the switching frequency for the sensor.

2. The method of claim 1, wherein the switching frequency is selected to reduce or eliminate an overlap between harmonic components of the sampled signal and one or more out-of-band interference signals.

3. The method of claim 1, wherein the sampling circuitry is turned on and off in sync with a waveform that is provided by the processing circuitry, such that the sampling circuitry is turned off on each falling edge of the waveform, and turned on on each rising edge of the waveform, or vice versa.

4. The method of claim 1, wherein at least one other component of the sensor is turned on and off at the selected frequency, the at least one other component being selected from the group consisting of a frequency chopper, an analog filter circuit, a memory module, and an amplifier.

5. The method of claim 1, wherein the analog signal is generated in response to a magnetic field and the sensing element includes a magnetic field sensing element.

6. The method of claim 1, wherein the analog signal is generated in response to a magnetic field, and the sensing element includes at least one of a Hall effect element, a giant magnetoresistor (GMR), or a tunnel magnetoresistor (TMR).

7. The method of claim 1, wherein the sensing element includes at least one of a light sensing element, a pressure sensing element, or a temperature sensing element.

8. A sensor, comprising:
a sensing element;
a sampling circuitry; and
a processing circuitry configured to:
select a switching frequency for the sensor, the switching frequency being a frequency at which at least the sampling circuitry of the sensor is turned on and off;
transition the sensor into a state in which the sampling circuitry of the sensor is turned on and off at the switching frequency;
receive a sampled signal that is generated as a result of the sampling circuitry sampling an analog signal, the analog signal being generated, at least in part, by the sensing element, the analog signal being sampled only at times when the sampling circuitry is turned on, such that no samples of the analog signal are captured when the sampling circuitry is turned off; and generate an output signal based, at least in part, on the sampled signal and output the output signal, wherein selecting the switching frequency for the sensor includes sampling the analog signal while the sampling circuitry is turned on and off at a first frequency to generate a first copy of the analog signal, the first copy being produced by filtering an output of the sampling circuitry with a first filter that corresponds to the first frequency; sampling the analog signal while the sampling circuitry is turned on and off at a second frequency to generate a second copy of the analog signal, the second copy being produced by filtering the output of the sampling circuitry with a second filter that corresponds to the second frequency; calculating a difference between the first copy and the second copy: when the difference meets a threshold, setting one of the first frequency or the second frequency as the switching frequency for the sensor; and when the difference does not meet the threshold, setting a third frequency as the switching frequency for the sensor.

9. The sensor of claim 8, wherein the switching frequency is selected to reduce or eliminate an overlap between harmonic components of the sampled signal and one or more out-of-band interference signals.

10. The sensor of claim 8, wherein the sampling circuitry is turned on and off in sync with a waveform that is provided by the processing circuitry, such that the sampling circuitry is turned off on each falling edge of the waveform and turned on on each rising edge of the waveform, or vice versa.

11. The sensor of claim 8, wherein at least one other component of the sensor is turned one and off at the select frequency, the at least one other component being selected from the group consisting of a frequency chopper, an analog filter circuit, a memory module, and an amplifier.

12. The sensor of claim 8, wherein the analog signal is generated in response to a magnetic field and the sensing element includes a magnetic field sensing element.

13. The sensor of claim 8, wherein the analog signal is generated in response to a magnetic field, and the sensing element includes at least one of a Hall effect element, a giant magnetoresistor (GMR), or a tunnel magnetoresistor (TMR).

14. The sensor of claim 8, wherein the sensing element includes at least one of a light sensing element, a pressure sensing element, or a temperature sensing element.

15. A non-transitory computer-readable medium that is configured to store one or more processor-executable instructions, which when executed by a processing circuitry cause the processing circuitry to perform the operations of:
selecting a switching frequency for a sensor, the switching frequency being a frequency at which at least a sampling circuitry of the sensor is turned on and off; and
transitioning the sensor into a state in which the sampling circuitry of the sensor is turned on and off at the switching frequency;
receiving a sampled signal that is generated as a result of the sampling circuitry sampling an analog signal, the analog signal being generated by at least one sensing element, the analog signal being sampled only at times when the sampling circuitry of the sensor is turned on, such that no samples of the analog signal are captured when the sampling circuitry is turned off; and
generating an output signal based, at least in part, on the sampled signal and outputting the output signal, wherein selecting the switching frequency for the sensor includes: sampling the analog signal while the sampling circuitry is turned on and off at a first frequency to generate a first copy of the analog signal, the first copy being produced by filtering an output of the sampling circuitry with a first filter that corresponds to the first frequency; sampling the analog signal while the sampling circuitry is turned on and off at a second frequency to generate a second copy of the analog signal, the second copy being produced by filtering the output of the sampling circuitry with a second filter that corresponds to the second frequency; calculating a difference between the first copy and the second copy: when the difference meets a threshold, setting one of the first frequency or the second frequency as the switching frequency for the sensor; and when the difference does not meet the threshold, setting a third frequency as the switching frequency for the sensor.

16. The non-transitory computer-readable medium of claim 15, wherein the switching frequency is selected to reduce or eliminate an overlap between harmonic components of the sampled signal and one or more out-of-band interference signals.

17. The non-transitory computer-readable medium of claim 15, wherein the analog signal is generated in response to a magnetic field and the sensing element includes a magnetic field sensing element.

18. The non-transitory computer-readable medium of claim 15, wherein the analog signal is generated in response to a magnetic field, and the sensing element includes at least one of a Hall element, a giant magnetoresistor (GMR), or a tunnel magnetoresistor (TMR).

19. The non-transitory computer-readable medium of claim 15, wherein the sensing element includes at least one of a light sensing element, a pressure sensing element, or a temperature sensing element.

20. A system comprising:
means for selecting a switching frequency for a sensor, the switching frequency being a frequency at which at least a sampling circuitry of the sensor is turned on and off; and
means for transitioning the sensor into a state in which the sampling circuitry of the sensor is turned on and off at the switching frequency;
means for receiving a sampled signal that is generated as a result of the sampling circuitry sampling an analog signal, the analog signal being generated by at least one sensing element, the analog signal being sampled only at times when the sampling circuitry is turned on, such that no samples of the analog signal are captured when the sampling circuitry is turned off; and
means for generating an output signal based, at least in part, on the sampled signal and outputting the output signal,
wherein selecting the switching frequency for the sensor includes: sampling the analog signal while the sampling circuitry is turned on and off at a first frequency to generate a first copy of the analog signal, the first copy being produced by filtering an output of the sampling circuitry with a first filter that corresponds to the first frequency; sampling the analog signal while the sampling circuitry is turned on and off at a second frequency to generate a second copy of the analog signal, the second copy being produced by filtering the output of the sampling circuitry with a second filter that corresponds to the second frequency; calculating a difference between the first copy and the second copy, when the difference meets a threshold, setting one of the first frequency or the second frequency as the switching frequency for the sensor, and when the difference does not meet a threshold, setting a third frequency as the switching frequency for the sensor.

* * * * *